United States Patent [19]

Colman et al.

[11] Patent Number: 4,604,640
[45] Date of Patent: Aug. 5, 1986

[54] DARLINGTON TRANSISTORS

[75] Inventors: Derek Colman, Bromham; David R. Cotton, Putnoe, both of England

[73] Assignee: Texas Instruments Incorporated, Dallas, Tex.

[21] Appl. No.: 656,216

[22] Filed: Oct. 1, 1984

[30] Foreign Application Priority Data

Oct. 3, 1983 [GB] United Kingdom ............... 8326451

[51] Int. Cl.$^4$ .................... H01L 27/02; H01L 27/04; H03K 3/26
[52] U.S. Cl. ...................................... 357/46; 357/48; 307/315
[58] Field of Search ..................... 357/46, 48; 307/315

[56] References Cited

FOREIGN PATENT DOCUMENTS 53-82179  7/1978  Japan .
55-16486  2/1980  Japan .
2061655   5/1981  United Kingdom ................. 357/46

OTHER PUBLICATIONS

Hartman et al, *High Current Darlington Transistors*, Elec. Engrg., vol. 54, No. 668, Aug. 1982, pp. 45–55.

Primary Examiner—Martin H. Edlow
Assistant Examiner—Terri M. Henn
Attorney, Agent, or Firm—Mel Sharp; N. Rhys Merrett; Gary C. Honeycutt

[57] ABSTRACT

In a darlington transistor having an integrated resistor connected from base to emitter of the output transistor element, the effect of the diode between collector and emitter formed when the resistor consists of an extension to the base region is reduced by forming at least part of the resistor either as an extension to the emitter region or as a separate region of the same conductivity type and connected to it. The resistor formed by the emitter region material appears in series with the diode.

6 Claims, 4 Drawing Figures

DARLINGTON TRANSISTORS

This invention relates to darlington transistors and especially but not exclusively to such transistors as will be used for power amplification.

The high current gain of darlington transistors makes them particularly suitable for power amplification. In addition, they can handle a higher current density than a bipolar transistor. However, there is a problem with a simple darlington transistor in that leakage current generated by the driver transistor is amplified by the output transistor which can result in the overall transistor having an excessive leakage current particularly at elevated temperatures. A solution to this problem has been to provide base-emitter resistors connected from the emitter to the base of each transistor element of the darlington. FIG. 1 shows the equivalent circuit diagram of such an arrangement where the resistors R1 and R2 are connected from base to emitter of the driver and output transistors T1 and T2 respectively. These resistors cause the gain of the transistors to be very low at low current levels, that is to say at the level of normal leakage current, but have little effect at operating current levels. For convenience and to avoid unnecessary manufacturing cost, the resistors are conventionally produced by regions integrated into the semiconductor material in which the transistors are themselves formed. FIG. 2 shows the cross-section of an example of a semiconductor substrate 1 in which the transistors T1 and T2 and their base-emitter resistors R1 and R2 are formed.

In FIG. 2, the transistor T1 has a base region 2 and an emitter region 3 with a base connection B connected to the region 2. The resistor R1 is formed by an addition 4 to the base region 2; for convenience the region 4 is shown as having a different depth from the region 2 so that it can be more readily seen, but in practice its depth would be the same as that of the region 2 and its width would be somewhat reduced so as to produce the required resistance value in a conveniently small size. Similarly, the transistor T2 has a base region 5 and an emitter region 6 to which an emitter connection E is joined. The substrate 1 provides the common collector region for the transistors T1 and T2 and has a connection C. The resistor R2, similarly to the region R1, is formed as an extension 7 of the base region 5 of the transistor T2 and the end of the resistor R2 remote from the base region 5 is connected to the emitter connection E. The corresponding connection is provided between the emitter region 3 of the transistor T1 and the base region 5 of the transistor T2.

In the arrangement shown in FIG. 2, the region 7 forming the resistor R2 being connected directly to the emitter connection E appears as a diode between the emitter and collector connections of the resulting darlington transistor. The polarity of the diode is such that it conducts only when the collector voltage is of the opposite polarity to that with which the transistor is intended to be operated. The existence of this diode is disadvantageous in many applications of darlington transistors and can be tolerated in other applications. There are, however, certain applications for darlington transistors where the existence of diode D is a nuisance.

It is an object of the present invention to reduce the effect of the diode D in a darlington transistor.

According to the present invention there is provided a darlington transistor having an output transistor element and at least one driver transistor element in which the output transistor element has an integrated resistor connected from base to emitter, wherein at least part of the integrated resistor is formed by a region of the same conductivity type as the emitter of the output transistor.

In a practical form of the invention, the driver and output transistors are of the same conductivity type and have integrated resistors connected from their bases to their emitters. The or each driver transistor has its base region extended to form an integrated base-emitter resistor which is formed by the same diffusion process as is used to produce the base region itself. In the output transistor the base-emitter resistor is formed at least partly by an additional diffusion region produced by the same diffusion process as is used to produce the emitter of that transistor. Part of the base-emitter resistor of the output transistor may be formed by an extension of its base region as with the driver transistor (s). The other part of the base-emitter resistor of the output transistor is isolated from the substrate by a heavily doped region of the same conductivity type as the base of the output transistor. If desired, the base-emitter resistor of the output transistor may be formed entirely by a region of the same conductivity type as the emitter of that transistor and it may be formed as an extension of the emitter region of that transistor. A disadvantage with this is that the emitter region has a higher conductivity than the base region so that a larger area of semiconductor substrate is needed to provide the necessary resistance than would be required using an extension of the base region to provide at least part of the resistance.

In order that the invention may be fully understood and readily carried into effect an example of it will now be described with reference to the accompanying drawings, of which:

Figure 1:
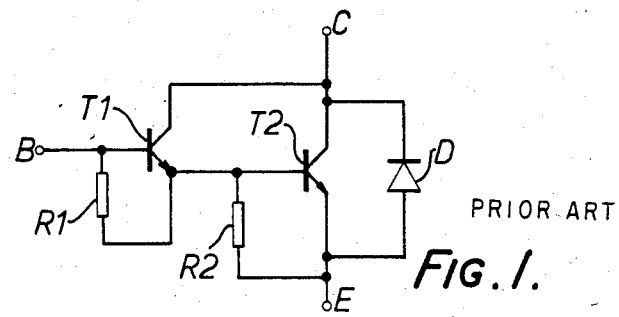
FIG. 1 is the circuit diagram of a prior art darlington transistor.
Figure 3:
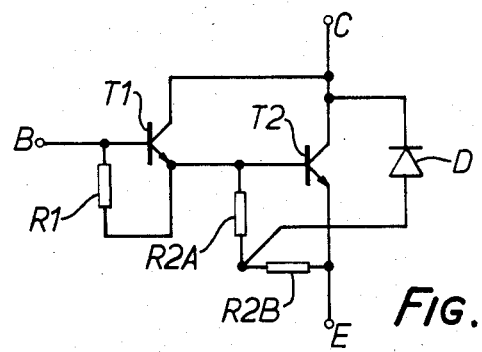
FIG. 3 is the circuit diagram of one example of a transistor according to the invention.

A comparison of FIGS. 1 and 3 will reveal that by comparison with a conventional darlington transistor a transistor of FIG. 3 has the base-emitter resistor of the output transistor T2 divided into two parts R2A and R2B, and the diode D is connected from the collector of the transistor T2 to the junction of the resistors R2A and R2B.

Figure 2:
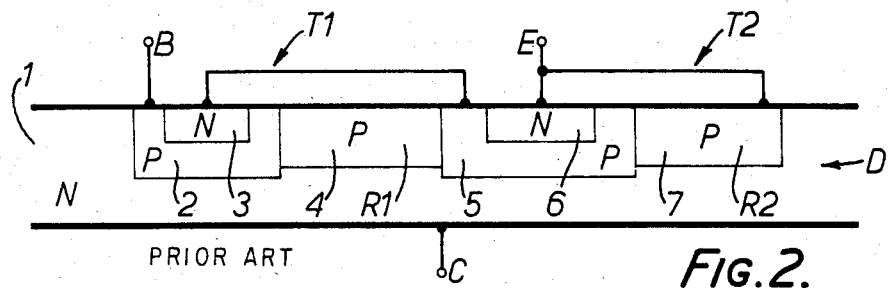
FIG. 2 shows the cross-section of an embodiment of the circuit of FIG. 1.
Figure 4:
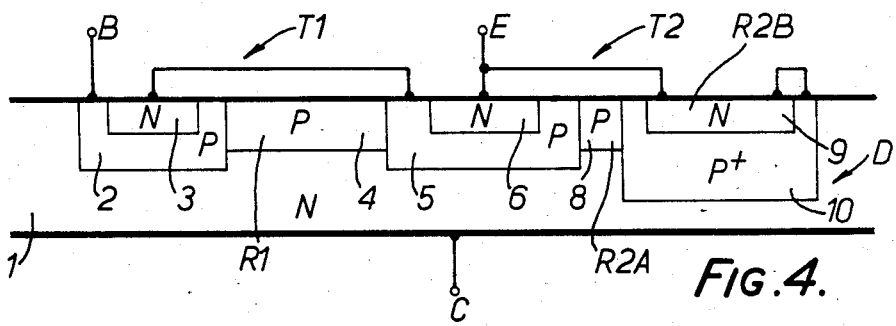
FIG. 4 is the cross-section of one embodiment of the circuit of FIG. 3.

FIG. 4 shows the cross-section of an embodiment of the circuit shown in FIG. 3 in which the transistor T1 has collector, base and emitter regions formed by the substrate 1 and the regions 2 and 3. A base connection B is connected to the region 2. The base-emitter resistor of the transistor T1 is formed by the region 4 which joins the region 2 to the region 5 which is the base region of the output transistor T2. The emitter of the transistor T2 is formed by the region 6 and has an emitter connection E joined to it. The substrate 1 also forms the collector region of the transistor T2 and has the collector connection C joined to it. An external connection is made from the emitter region 3 of the transistor T1 to the base region 5 of the transistor T2. The arrangement of FIG. 4 differs from that shown in FIG. 2 in the formation of the base-emitter resistor of the transistor T2 which is formed as two parts R2A and R2B provided respectively by the regions 8 and 9. The region 8 is of the same conductivity type as the region 5, and the region 9 is of the same conductivity type as the region 6. It is possible for the region 9 to be formed as a direct extension of the region 6, although it is not shown as such in FIG. 4 and may not have the same impurity concentration. A heavily doped region 10 serves to isolate the region 9 from the substrate 1 and is heavily doped to ensure that substantially no vertical transistor action exists between the region 9 and the substrate 1. One end of the region 9 is connected directly to the connection E and the other end is connected through the region 10 to the end of the region 8 remote from the base region 5 of the transistor T2. Thus, the resistor R2 is formed by the regions 8 and 9 in series. Although the region 10 is included in this series path, its resistivity is sufficiently low as to be insignificant. Although regions 4 and 8 are shown as having different depths from regions 2 and 5, they would in practice be formed by the same diffusion process and therefore all have the same depth but would be restricted in width so as to provide the desired resistance value in compact form.

In a typical application, the value of R2A might be 800Ω and that of R2B 200Ω. As the major part of the resistance R2 (=R2A+R2B) is close tolerance base diffusion the composite tolerance on the overall value of R2 is good and in this example five times better than would be if R2 were formed entirely by emitter diffusion material. In the form of the invention shown in FIGS. 3 and 4, the effect of the diode D is not completely eliminated but its action is reduced to an insignificant level. In the event that the collector C becomes negatively charged with respect to the emitter (assuming the conductivity types shown in FIG. 4), then the diode D becomes forward biassed. However, the component R2B is in series with the diode D and this limits the current flow through the diode to a negligible value so that the diode can be considered for practical purposes not to exist. It should be noted that the choice of the value of R2B should be made so that it is sufficiently high to reduce the forward current through the diode to an insignificant level but it must be small enough that it does not lead to an undesirable large increase in bar area or result in too great variations in the overall value of the composite resistor R2 in production devices.

In an alternative embodiment, the whole of the resistor R2 is formed from emitter diffusion, for example as an extension of the emitter region 6 or as a totally separate region connected to it. The disadvantage of this is that the sheet resistance of the emitter region is of the order of 1 to 5Ω/square with the result that the necessary resistance value calls for a very long resistor to be produced and the consequent increase in the bar area acquired as compared with the conventional darlington transistor which uses base diffusion material which has a typical sheet resistance of 100 to 200Ω/square. A further disadvantage of the use of emitter diffusion only to form R2 is that the sheet resistance of the emitter diffusion is usually not so well controlled as that of the base diffusion material in production devices. Nevertheless, such a structure may be of value in certain applications of darlington transistors.

Although the invention has been described with reference to n-p-n devices it could of course also be applied to p-n-p devices.

What we claim is:

1. A darlington transistor having an output transistor element and at least one driver transistor element in which the output transistor element has an integrated resistor connected from base to emitter, wherein at least part of the integrated resistor is formed by a resistive region of the same conductivity type as the emitter of the output transistor element.

2. A transistor according to claim 1 formed in a body of semiconductor material of a first conductivity type with the bases of the transistor elements provided by regions of a second conductivity type opposite to the first in a major surface of the body and the emitters of the transistor elements provided by regions of the first conductivity type in the respective base regions at the major surface, and using the body as a common collector, wherein the said resistive region forming the part of the integrated resistor is of the first conductivity type and at the major surface of the body.

3. A transistor according to claim 2 wherein said resistive region forming the part of the integrated resistor is contained by a further region extending to the major surface all round the first-mentioned region and of the second conductivity type, the further region serving to isolate the first-mentioned region from the remainder of the body.

4. A transistor according to claim 3 wherein the further region has a high concentration of dopant, an ohmic connection is made from the first-mentioned region to the further region at the major surface and the further region is connected to the base of the output transistor element, the further region also forming part of the integrated resistor.

5. A transistor according to claim 4 wherein the region forming the base of the output transistor has an extension which abuts on the further region, whereby the integrated resistor is formed by the first-mentioned region, the further region and the extension to the base region.

6. A transistor according to claim 2 wherein the first-mentioned region forming at least part of the integrated resistor is provided as an extension to the region forming the emitter of the output transistor element.

* * * * *